(12) United States Patent
Ikeda et al.

(10) Patent No.: US 9,721,951 B2
(45) Date of Patent: Aug. 1, 2017

(54) SEMICONDUCTOR DEVICE USING GE CHANNEL AND MANUFACTURING METHOD THEREOF

(71) Applicant: KABUSHIKI KAISHA TOSHIBA, Tokyo (JP)

(72) Inventors: Keiji Ikeda, Tokyo (JP); Tsutomu Tezuka, Ibaraki (JP); Yuuichi Kamimuta, Mie (JP); Kiyoe Furuse, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/577,209

(22) Filed: Dec. 19, 2014

(65) Prior Publication Data

US 2015/0102419 A1    Apr. 16, 2015

Related U.S. Application Data

(63) Continuation of application No. PCT/JP2013/055527, filed on Feb. 28, 2013.

(30) Foreign Application Priority Data

Jun. 19, 2012  (JP) ................ 2012-138103

(51) Int. Cl.
*H01L 29/04*    (2006.01)
*H01L 29/10*    (2006.01)
(Continued)

(52) U.S. Cl.
CPC ...... *H01L 27/092* (2013.01); *H01L 21/02532* (2013.01); *H01L 21/02592* (2013.01);
(Continued)

(58) Field of Classification Search
USPC ........................................ 257/369; 438/199
See application file for complete search history.

(56) References Cited

U.S. PATENT DOCUMENTS 6,620,665 B1 * 9/2003 Sugahara .......... H01L 21/02164
257/E21.09
2006/0170046 A1   8/2006 Hara
(Continued)

FOREIGN PATENT DOCUMENTS

JP          5-90517      4/1993
JP       2006-210828     8/2006
(Continued)

OTHER PUBLICATIONS

Batude et al.; "Demonstration of Low Temperature 3D Sequential FDSOI Integration Down to 50 nm gate Length", 2011 Symposium on VLSI Technology Digest of Technical Papers, pp. 158-159, (2011).
(Continued)

*Primary Examiner* — Olik Chaudhuri
*Assistant Examiner* — Wilner Jean Baptiste
(74) *Attorney, Agent, or Firm* — Finnegan, Henderson, Farabow, Garrett & Dunner, LLP

(57) ABSTRACT

According to one embodiment, a semiconductor device includes a first complementary semiconductor device provided on a semiconductor substrate, and including a CMOS circuit, a metal electrode provided above the first complementary semiconductor device, a semiconductor layer provided above the metal electrode, including an nMOS region and a pMOS region separated from each other, and containing Ge; and a second complementary semiconductor device including an nMOSFET provided on the first portion of the semiconductor layer and a pMOSFET provided on the second portion of the semiconductor layer.

9 Claims, 5 Drawing Sheets

(51) Int. Cl.
*H01L 31/00* (2006.01)
*H01L 27/092* (2006.01)
*H01L 23/522* (2006.01)
*H01L 27/02* (2006.01)
*H01L 21/8238* (2006.01)
*H01L 27/06* (2006.01)
*H01L 25/065* (2006.01)
*H01L 21/02* (2006.01)
*H01L 21/324* (2006.01)
*H01L 29/165* (2006.01)
*H01L 29/49* (2006.01)
*H01L 29/51* (2006.01)
*H01L 27/12* (2006.01)
*H01L 29/786* (2006.01)

(52) U.S. Cl.
CPC ...... *H01L 21/02667* (2013.01); *H01L 21/324* (2013.01); *H01L 21/823807* (2013.01); *H01L 23/5226* (2013.01); *H01L 25/0657* (2013.01); *H01L 27/0207* (2013.01); *H01L 27/0688* (2013.01); *H01L 29/165* (2013.01); *H01L 29/4966* (2013.01); *H01L 29/517* (2013.01); *H01L 21/823871* (2013.01); *H01L 21/823878* (2013.01); *H01L 27/0922* (2013.01); *H01L 27/1203* (2013.01); *H01L 29/78684* (2013.01); *H01L 2225/06513* (2013.01); *H01L 2225/06541* (2013.01); *H01L 2924/0002* (2013.01)

(56) References Cited

U.S. PATENT DOCUMENTS

| | | |
|---|---|---|
| 2006/0281232 A1 | 12/2006 | Hsu et al. |
| 2007/0218622 A1 | 9/2007 | Lee et al. |
| 2009/0206490 A1 | 8/2009 | Koide et al. |
| 2010/0148171 A1 | 6/2010 | Hayashi et al. |
| 2010/0190334 A1* | 7/2010 | Lee ............... H01L 21/2007 438/637 |
| 2011/0140099 A1 | 6/2011 | Yamazaki |
| 2011/0175172 A1* | 7/2011 | Matsuki ........... H01L 21/28088 257/369 |
| 2013/0203248 A1* | 8/2013 | Ernst ............... H01L 21/8221 438/530 |

FOREIGN PATENT DOCUMENTS

| | | |
|---|---|---|
| JP | 2006-344941 | 12/2006 |
| JP | 2007-251131 | 9/2007 |
| JP | 2010-141230 | 6/2010 |
| JP | 2011-142314 | 7/2011 |
| JP | 2012-28731 | 2/2012 |
| JP | 2012-84851 | 4/2012 |
| TW | 200941664 | 10/2009 |

OTHER PUBLICATIONS

Batude et al.; "Advances, Challenges and Opportunities in 3D CMOS Sequential Integration", IEEE, pp. 7.3.1-7.3.4, (2011).

Naito et al.; "World's First Monolithic 3D-FPGA with TFT SRAM over 9nm 9 Layer Cu CMOS", 2010 Symposium on VLSI Technology Digest of Technical Papers, pp. 219-220, (2010).

English-language International Search Report from the Japanese Patent Office for International Application No. PCT/JP2013/055527, mailing date Mar. 26, 2013.

English-language International Preliminary Report on Patentability from The International Bureau of WIPO for International Application No. PCT/JP2013/055527, mailing date Dec. 31, 2014.

Notice of Examination Results issued by the Taiwanese Intellectual Property Office on Jan. 27, 2015, for Taiwanese Patent Application No. 102108627, and English-language translation thereof.

First Office Action issued by the Japanese Patent Office on Jun. 23, 2015, for Japanese Patent Application No. 2012-138103, and English-language translation thereof.

* cited by examiner

SEMICONDUCTOR DEVICE USING GE CHANNEL AND MANUFACTURING METHOD THEREOF

CROSS-REFERENCE TO RELATED APPLICATIONS

This application is based upon and claims the benefit of priority from prior Japanese Patent Application No. 2012-138103, filed Jun. 19, 2012, the entire contents of which are incorporated herein by reference.

FIELD

The present embodiment relates to a semiconductor device using a Ge channel, and also to a manufacturing method thereof.

BACKGROUND

To enhance performance and reduce power consumption of semiconductor integrated devices, the three-dimensional stacking of transistors has been used since it is effective in reducing the parasitic capacitance and the parasitic resistance caused by short wiring. As technology for providing the three-dimensional stacking, the technology for stacking Si chips and connecting them by Through Silicon Vias (TSV) is under development. However, since the TSV size is greater than the wiring intervals of an ordinary CMOS process by at least two orders of magnitude, there is a limit to how much the wiring density can be increased for the purpose of enhancing wiring efficiency. In addition, since the area penalty for the TSV is large and is not negligible, the design of circuits may be affected and the manufacturing cost may increase. For this reason, there is a demand for technology for enabling wiring connection to be performed at higher density.

As a method for solving the area penalty problem of the TSV, there is a proposal wherein SOI substrates are pasted and stacked in three dimensions. According to this proposal, the performance of an upper transistor is almost the same as that of a base CMOS. (See P. Batude et al., VLSI Technical Digest, (2011) p. 158 (a)nd P. Batude et al., IEDM Technical Digest, (2011) p. 151). However, this proposal has some problems to be solved, such as high manufacturing cost due to the pasting of crystalline Si layers, and the adverse effects which the process temperature of upper layer transistors (which is as high as 600° C.) may have on the ground CMOS.

It is proposed to provide an a-Si-TFT CMOS between intermediate wiring layers of a CMOS or on top of the wiring layers of a CMOS. (See T. Naito et al., 2010 Symposium on VLSI Technology, Technical Digest Papers, p. 219). However, the performance of the a-Si-TFT is markedly inferior to that of an ordinary type of Si-SMOS, and it is hard to determine a proper threshold. For this reason, the driving voltage is inevitably high, or the leak current is high. Despite the three-dimensional stacking, however, the performance is not very enhanced, and the consumption power is not reduced sufficiently.

DETAILED DESCRIPTION

In general, according to one embodiment, a semiconductor device includes a first complementary semiconductor device formed on a semiconductor substrate, and including a CMOS circuit, a metal electrode formed above the first complementary semiconductor device, a semiconductor layer provided above the metal electrode, including an nMOS region and a pMOS region separated from each other, and containing Ge; and a second complementary semiconductor device including an nMOSFET provided on the nMOS region of the semiconductor layer and a pMOSFET provided on the pMOS region of the semiconductor layer.

Embodiments will now be described with reference to the accompanying drawings.

(First Embodiment)

Figure 1:
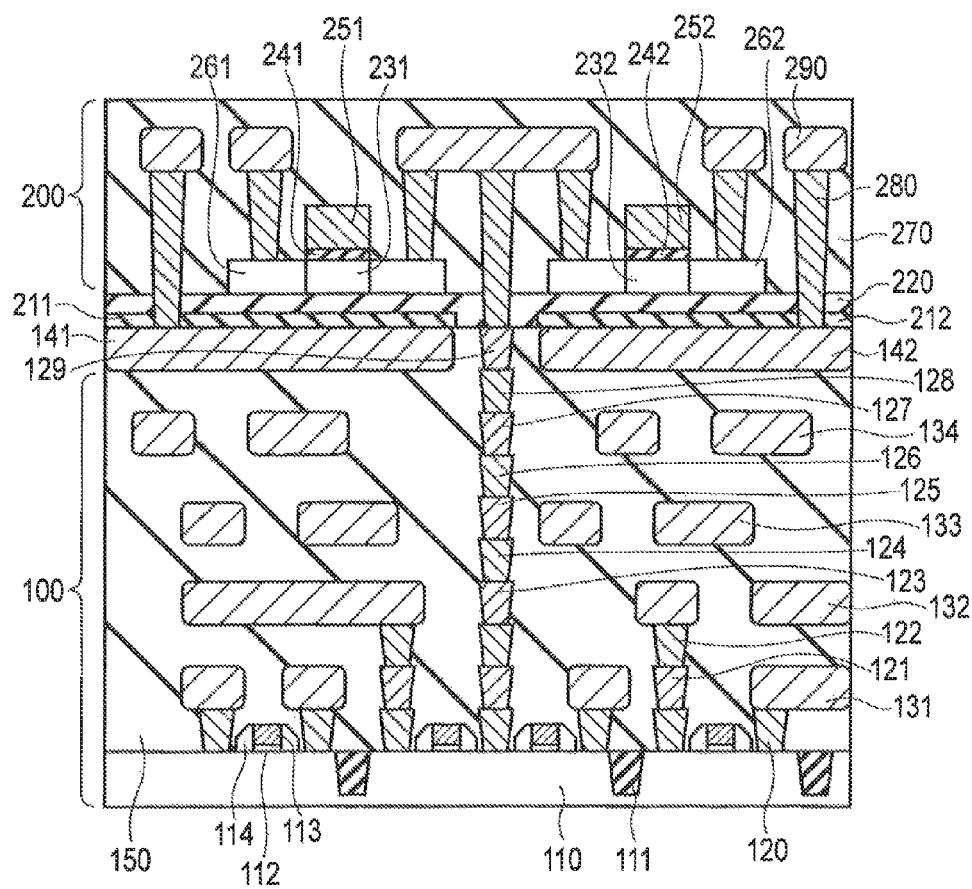
FIG. 1 is a cross sectional view illustrating an element structure of a semiconductor device according to the first embodiment.

FIG. 1 is a cross sectional view illustrating an element structure of a semiconductor device according to the first embodiment.

In FIG. 1, a base CMOS circuit (a first complementary semiconductor device) 100 is provided on an Si support substrate 110. More specifically, an nMOSFET and a pMOSFET, each comprising a gate insulation film 112, a gate electrode 113 and a source/drain region (not shown), are provided on the substrate 110. Multi-layered wiring layers 131-134 are provided on the resultant structure (the nMOSFET and the pMOSFET), thereby forming a Si-CMOS circuit. Metal electrodes 141 and 142 are included in the uppermost layer, in the same process as the wiring layers 131-134 and vias 120-129.

A work function control layer 211 for the pMOS is provided on metal electrode 141, and a work function control layer 212 for the nMOS is provided on metal electrode 142. A semiconductor layer 231 containing Ge as a main component is provided above work function control layer 211, with an interlayer insulation film 220 interposed. A pMOSFET, comprising a gate insulation film 241, a gate electrode 251 and a metal S/D 261, is provided on the semiconductor layer 231. A semiconductor layer 232 containing Ge as a main component is provided above work function control layer 212, with an interlayer insulation film 220 interposed. An nMOSFET, comprising a gate insulation film 242, a gate electrode 252 and a metal S/D 262, is provided on the semiconductor layer 232. In other words, an upper CMOS circuit using Ge as a channel (a second complementary semiconductor device) is provided.

In FIG. 1, reference numeral 111 denotes an element-isolating insulation film, reference numeral 114 denotes a gate sidewall insulation film, and reference numeral 150 denotes an interlayer insulation film for the lower-layer CMOS circuit. Reference numeral 270 denotes an interlayer insulation film for the upper-layer CMOS circuit, reference numeral 280 denotes a via for the upper-layer CMOS circuit, and reference numeral 290 denotes a wiring layer for the upper-layer CMOS circuit.

As described above, in the present embodiment, the lower layer comprises an Si-CMOS circuit 100, and an upper-layer Ge-CMOS circuit 200 comprising a pMOSFET with a Ge channel and an nMOSFET with a Ge channel is provided above the Si-CMOS circuit 100, with an interlayer insulation film interposed. The lower-layer Si-CMOS circuit 100 and the upper-layer Ge-CMOS circuit 300 are electrically connected together, using via wiring.

In the present embodiment, a Ge-CMOS circuit 200 serving as a so-called "Black End Of Line Transistor" (GEOL Tr.) is provided between the uppermost layer (290) and its adjacent lower layer (141 and 142). The BEOL Tr. is not limited to this position. If a base electrode is provided for a first intermediate layer (e.g., wiring layer 131), the BEOL Tr. may be provided between the first and second layers (132) (in which case, the BEOL Tr. is provided at the lowermost position) or at any desired position upper than this.

Figure 2:
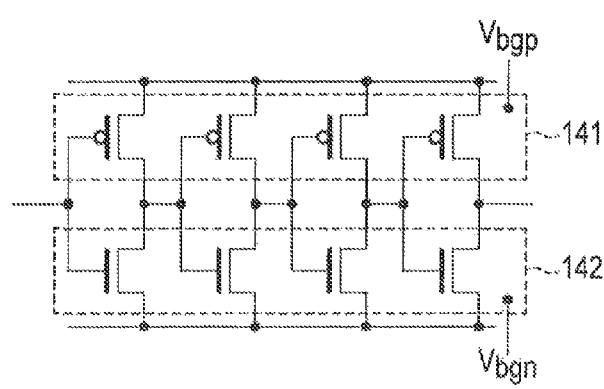
FIG. 2 is an equivalent circuit diagram illustrating how the semiconductor device of the first embodiment is applied to a CMOS inverter.
Figure 3:
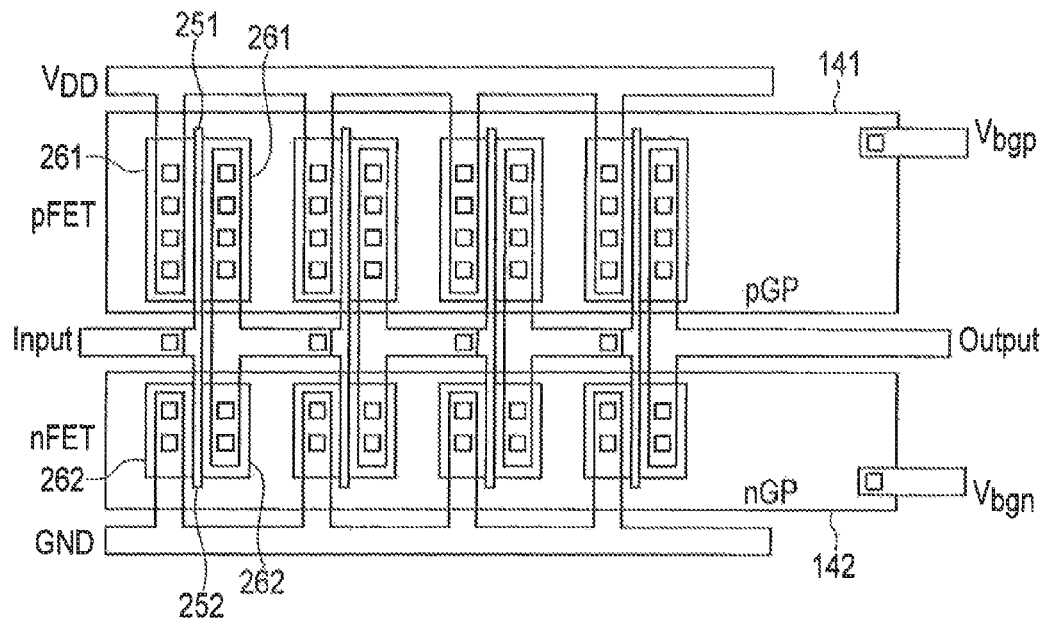
FIG. 3 is a layout diagram illustrating how the semiconductor device of the first embodiment is applied to a CMOS inverter.

FIGS. 2 and 3 illustrate a CMOS circuit in which the BEOL Tr. of the present embodiment is used for forming an inverter. FIG. 2 is an equivalent circuit diagram, and FIG. 3 is a layout diagram. In each circuit block comprising a pMOSFET and an nMOSFET, metal electrodes 141 and 142 provided by the lower wiring layer are arranged. Metal electrodes 141 and 142 are independently applied with Vbgp and Vbgn by backgate bias power sources, which are provided independently of the signal lines.

Figure 4:
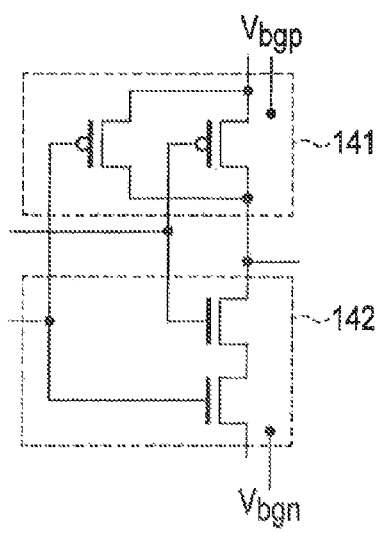
FIG. 4 is an equivalent circuit diagram of the case where the semiconductor device of the first embodiment is applied to a CMOS inverter.
Figure 5:
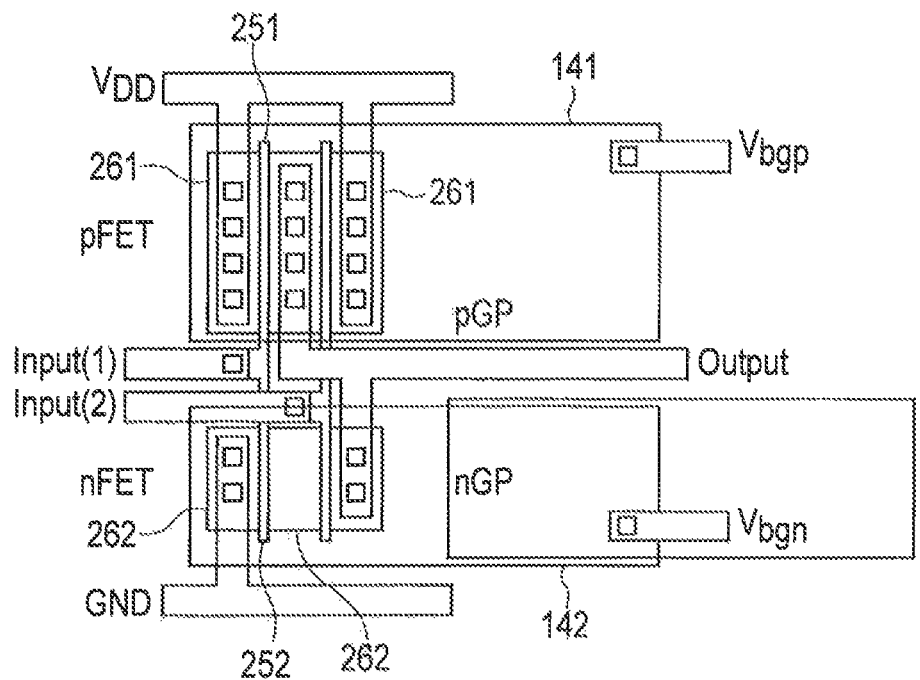
FIG. 5 is a layout diagram illustrating the case where the semiconductor device of the first embodiment is applied to a NAND circuit.

FIGS. 4 and 5 illustrate a CMOS circuit in which the BEOL Tr. of the present embodiment is used for forming a NAND circuit. FIG. 4 is an equivalent circuit diagram, and FIG. 5 is a layout diagram. As in the examples shown in FIGS. 2 and 3, in each circuit block comprising a pMOSFET and an nMOSFET, metal electrodes 141 and 142 provided by the lower wiring layer are arranged. These metal electrodes can be applied with Vbgp and Vbgn by the backgate bias voltage. The threshold voltages of the nMOSFET and pMOSFET can be independently controlled in both the boost and sleep directions. It is therefore possible to provide a configuration wherein the threshold voltage can be adaptively determined in accordance with the operation frequency and required speed of the circuit.

Figure 6:
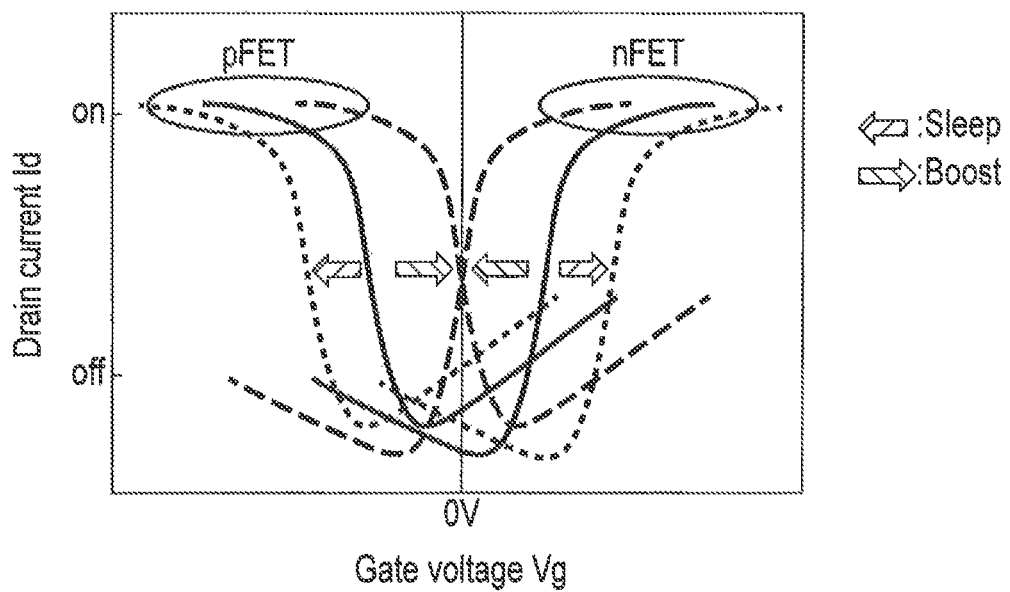
FIG. 6 is a graph illustrating the threshold characteristics of a pMOSFET with a Ge channel and an nMOSFET with a Ge channel.

FIG. 6 is a graph illustrating the threshold characteristics of a pMOSFET with a Ge channel and an nMOSFET with a Ge channel. In FIG. 6, the solid line represents the case where the control is not performed, the broken line represents a boost state where the backgate voltage is adjusted (Vbgn>0, Vbgp<0), and the dot line represents a sleep state where the backgate voltage is adjusted (Vbgn≤0, Vbgp≥0). The boost state is suitable for a high-speed operation since the ON current increases in that state. The sleep state is suitable for a low-power-consumption operation since the OFF current decreases in that state.

By controlling the backgate voltages independently, the threshold of the pMOSFET using the Ge channel and that of the nMOSFET using the Ge channel can be shifted from each other. Accordingly, the Ge-CMOS circuit can be designed to have the characteristics required of the apparatus.

In the present embodiment, the BEOL Tr. provided in an intermediate wiring layer or an uppermost layer has a higher degree of mobility than a-Si, and this is so in both the nMOSFET and the pMOSFET. The BEOL Tr. can be provided using a poly-Ge channel with which an increase in the current driving power can be expected. The transistors are provided above the metal electrodes (around plane) 141 and 142 simultaneously with the wiring layers, in such a manner that work function control layers 211 and 212 and the interlayer insulation film 220 are interposed between the transistors and the metal electrodes 141 and 142. The voltages applied to the nMOSFET and pMOSFET on the GP is controlled using independent power supply lines, which are independent of the signal lines of the so-called FEOL Tr. (Front End Of Line Transistor) and the BEOL transistor included in the base Si-CMOS circuit 100. By controlling the voltages in this manner, dynamic threshold control is enabled. The BEOL Tr. of the nMOSFET and that of the pMOSFET may be configured as a depletion type or as an inversion type. The work function control layers 211 and 212 deposited on the GP enable threshold setting in accordance with circuit requirements.

In the conventional configuration, the performance of the BEOL Tr. of the intermediate wiring layer or uppermost layer and the process cost thereof have a trade-off relationship. In other words, the high performance of the BEOL Tr. and the decrease in the process cost cannot be achieved at a time. In the present embodiment, in contrast, a BEOL Tr. having a proper threshold and current driving power can be provided at a process temperature that does not degrade the base CMOS circuit (FEOL Tr.).

As described above, the present embodiment uses a Ge channel in the upper layer CMOS circuit 200, and this enables a low process temperature as well as high performance (low voltage operation) arising from a higher degree of mobility than Si. In addition, the wiring formation step and the backgate (ground plane) formation step can be merged into a single step, resulting in the reduction of the process cost. Furthermore, since the backgates can be provided by the metal electrodes 141 and 142 and can be used in common to the nMOSFET and the pMOSFET. Thanks to these features, the present embodiment avoids the gate depletion problem, which is a serious problem to the conventional art wherein the GP is provided by implanting ions into a semiconductor.

The work function control layers 211 and 212 deposited on the GP are allowed to have proper thresholds. This enables a decrease in the OFF current in the standby mode, resulting in the low power consumption. Even if the thresholds are set to the above thresholds, they can be temporarily lowered when a high-speed operation is required, by biasing the backgate (GP) voltage in the boost direction. In this way, adaptive power control is enabled, thereby contributing the high performance, low consumption and low cost of a 3D-CMOS. Since the source/drain is provided of a NiGe alloy, it can be designed to have a low resistance.

As can be seen from the foregoing, the problems of the background art can be comprehensively solved by properly determining and combining channel materials, polarities, and electrode structures. It is therefore possible to provide a 3D-CMOS featured by high performance, low consumption power and low manufacturing process.

(Second Embodiment)

Figure 7:
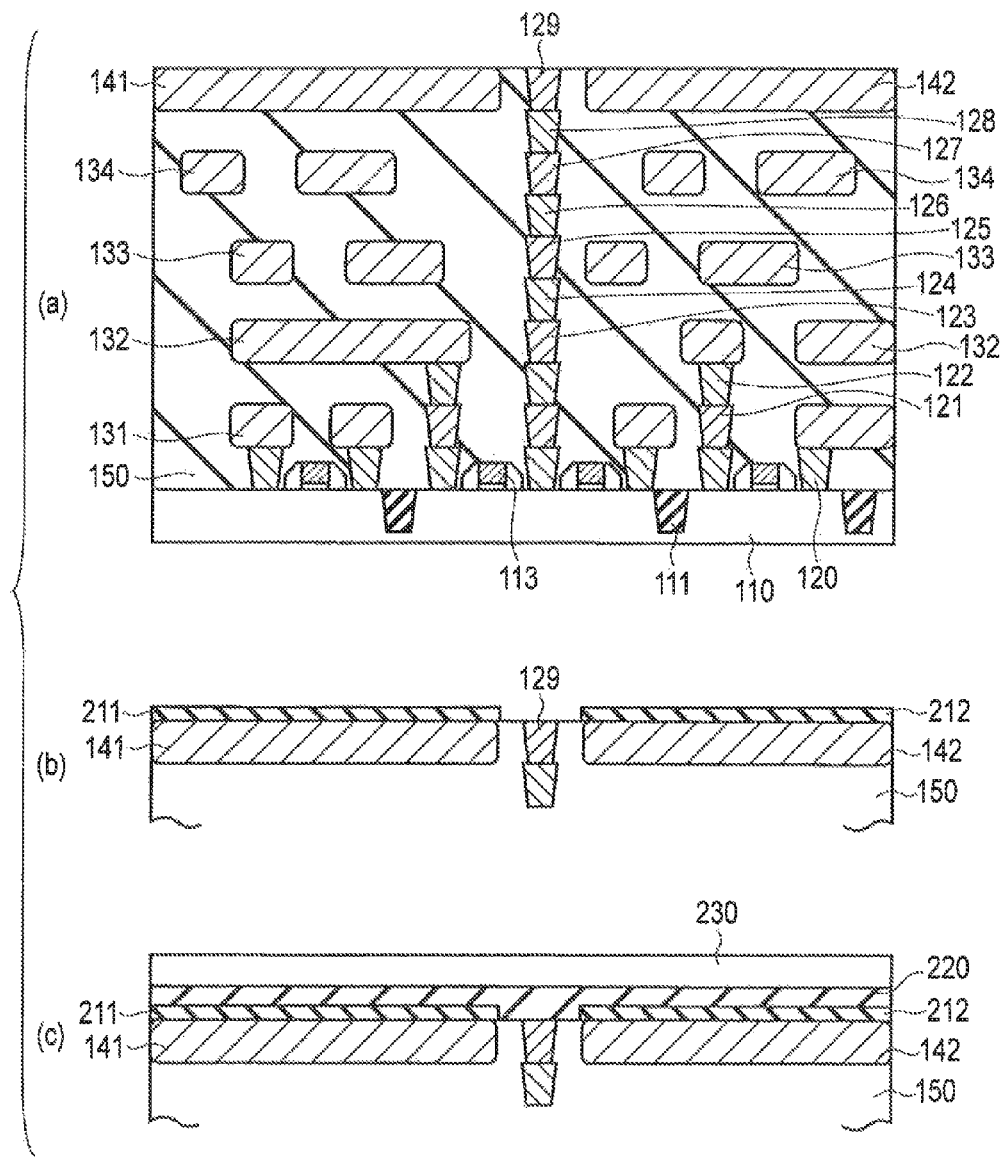
FIG. 7 is a cross sectional view illustrating the manufacturing process of a semiconductor device according to the second embodiment.
Figure 8:
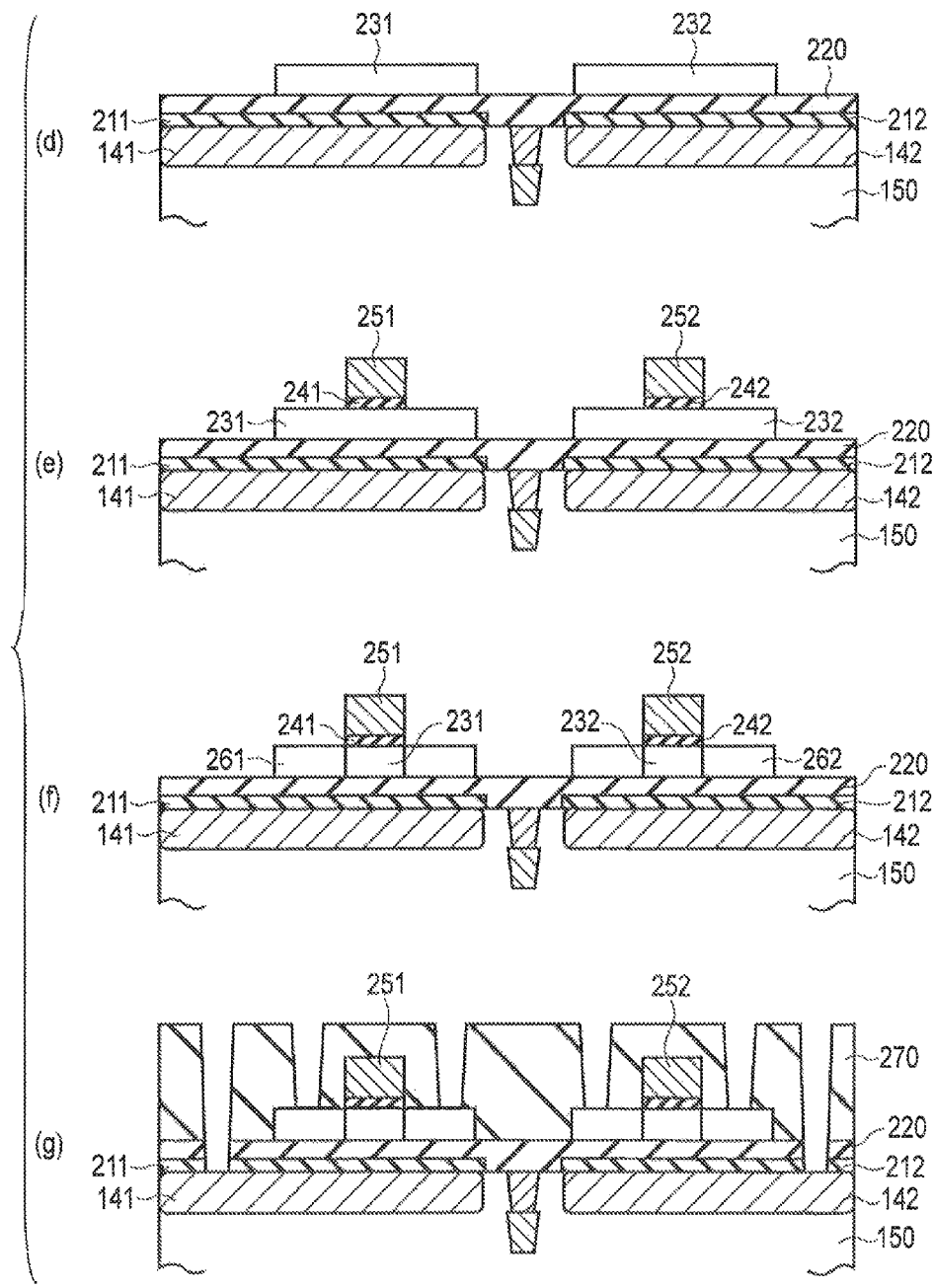
FIG. 8 is a cross sectional view illustrating the manufacturing process of the semiconductor device according to the second embodiment.

A description will now be given with reference to FIGS. 7 and 8 as to how the semiconductor device shown in FIG. 1 is manufactured. In FIGS. 7 and 8, like reference numerals denote like parts in FIG. 1, and a detailed description to such parts will be omitted.

As shown in FIG. 7(a), a pMOSFET and an nMOSFET are formed on an Si support substrate 11 in a known process. These MOSFETs are connected by means of wiring layers 131-134 and vias 120-129, thereby forming an Si-CMOS circuit (a first complementary semiconductor device) 100. At the time, metal electrode 141 for the pMOS and metal electrode 142 for the nMOS are provided in the uppermost layer, using the same process as the wiring layers 131-134. A via 129 electrically connected to the transistors of the Si-CMOS circuit 100 is exposed in the top surface of the Si-CMOS circuit 100 at a position different from those of the metal electrodes 141 and 142.

A so-called damascene process can be used for forming the metal electrodes 141 and 142. For example, a trench having a pattern corresponding to the backgate of a BEOL Tr. is formed in the surface of an interlayer insulation film 150, and subsequently a metallic material is deposited over the resultant structure. By flattening the surface by CMP, the metal electrodes 141 and 142 are allowed to remain only in the trench. A barrier metal may be formed in the trench prior to the formation of metal films. The wiring layers 131-134 may have a barrier metal at positions where they are in contact with the interlayer insulation film 150. If required, the vias 120-129 may have a barrier metal at the interface with the base member.

Next, as shown in FIG. 7(b), n-formation and p-formation processes may be performed individually using an ordinary lithography step, instead of providing an ordinary type of barrier metal. In this case, work function control layer 211 for the pMOSFET is formed in a pMOS region, while work function control layer 212 for the nMOSFET is formed in an nMOS region. To be more specific, a TiN film (work function control layer) 211 is formed on metal electrode 141 by sputtering, and an $HfO_2$/TiN film (work function control layer) 212 is formed on metal electrode 142 by sputtering. The work function control layer 211, 212 may comprise TaN.

Next, as shown in FIG. 7(c), an interlayer insulation film 220 having a thickness of 10 nm is formed on the work function control layers 211 and 212 by deposition. Subsequently, an a-Ge layer 230 having a thickness of 30 nm and serving as a channel of the upper layer CMOS circuit is formed by CVD or sputtering. The interlayer insulation film 220 comprises a rare-earth oxide. The interlayer insulation film 220 may comprise one of a hafnium oxide ($HfO_2$), an aluminum oxide ($Al_2O_3$) and a hafnium aluminum oxide (HfAlO).

As shown in FIG. 8(d), an active pattern corresponding to the pMOS region and the nMOS region is subjected to mesa etching, by which elements are isolated like islands. Thereafter, the resultant structure is annealed at a low temperature (not higher than 500° C.), so that the a-Ge has a polycrystalline structure. In this fashion, poly-Ge layers 231 and 232 are formed. In other words, poly-Ge layer 231 is formed above metal electrode 141 serving as the backgate for the pMOSFET, with the work function control layer 211 and the interlayer insulation film 220 interposed. Likewise, poly-Ge layer 232 is formed above metal electrode 142 serving as the backgate for the nMOSFET, with the work function control layer 212 and the interlayer insulation film 220 interposed.

Since the metal electrodes 141 and 142 are located under the a-Ge layer 230, heat can be easily radiated from the a-Ge layer 230 at the time of annealing. As a result, the crystallization is accelerated, increasing the size of the crystalline particles. After being annealed, the Ge layers 231 and 232 have a polycrystalline structure. Even if the elements are miniaturized and the channel length is approximately equal to the grain size, the polycrystalline structure can be regarded as a monocrystalline structure.

As shown in FIG. 8(e), either an $Al_2O_3$ film (4 nm) formed by ALD at 250° C. or an $SiO_2$ (5 nm) formed by PECVD is deposited over the Ge layers 231 and 232 as a gate insulation film. The resultant structure is overlaid with a TaN film (30 nm) by sputtering. Gate electrodes are formed by executing gate patterning and etching of the normal lithography process. To be more specific, gate electrode 251 is formed on gate insulation film 241 in the pMOS region, and gate electrode 252 is formed on gate insulation film 242 in the nMOS region. Both side regions of each of the gate electrodes 251 and 252 may be oxidized to form sidewall insulation films.

As shown in FIG. 8(f), a metal S/D 261 of a NiGe alloy formed by Ni deposition and low-temperature annealing (<350° C.) is provided as the source/drain of the pMOSFET. A NiGe alloy is provided in the nMOSFET as well. This NiGe alloy in the nMOSFET is formed by doping sulfur (S) as impurities before the deposition of Ni. Therefore a high-concentration sulfur segregation region is formed at the NiGe/Ge interface when NiGe is formed. A metal S/D 262 having this structure is formed in the nMOSFET. By the segregation of S, the Schottky barrier between the metal S/D (NiGe) 262 and the Ge layer 232 is controlled so that the parasitic resistance is reduced and the driving current is increased. Thereafter, the Ni film that remain unreacted is removed using diluted hydrochloric acid or the like.

As shown in FIG. 8(g), an interlayer insulation film 270 is formed all over the resultant structure, and contact holes are formed for connection to the metal electrodes 141 and 142 (serving as backgates) and to the source/drain regions 251 and 252. Subsequently, the contact holes are filled with a conductive material such as Cu, and the surface of the resultant structure is flattened. Thereafter, Al wiring layers 290 is formed to provide a CMOS circuit. In this manner, the structure shown in FIG. 1 is fabricated. A passivation film may be provided, if required.

Like the metal electrodes 141 and 142 and wiring layers 131-134, wiring layer 290 may be formed using the damascene process. In other words, in the process illustrated in FIG. 8(g), wiring grooves may be formed in addition to the contact holes and filled with a metallic material.

As described above, both the pMOS and nMOS of the upper layer CMOS circuit 200 of the present embodiment use poly-Ge layers 231, 232 as channels, which have a higher degree of mobility than the a-Si. As a result, it is possible to provide a higher-speed device. As compared with Si, Ge can be formed at a low temperature. Therefore, adverse effects on the lower layer Si-CMOS circuit 100 can be reduced when the upper layer Ge-CMOS circuit 200 is formed.

In addition, the wiring formation step and the backgate (ground plane) formation step can be merged into a single step, resulting in the reduction of the process cost. In the steps illustrated in FIGS. 7(c) and 8(e), the metal electrodes 141 and 142 are located under the a-Ge layer 230, heat can be easily radiated from the a-Ge layer 230 at the time of annealing. As a result, the crystallization is accelerated, increasing the size of the crystalline particles.

(Modifications)

The embodiments described above are not restrictive.

The substrate on which the second complementary semiconductor device is formed is not limited to the Ge layer described above but may be a layer containing Ge as the main component. Likewise, the substrate on which the first complementary semiconductor device is formed is not limited to the Si substrate described above but may be a Ge substrate or a compound semiconductor substrate.

In the embodiments described above, the Ge-channel MOSFET structure of the second complementary semiconductor device uses Ni/Ge as a source/drain. However, the source/drain is not limited to this. Other metallic materials such as an alloy of Ge and any one of Co, PD and Pt may be used. In addition, the source/drain is not limited to an alloy but may be a diffusion layer doped with impurities. In addition, the Ge channel MOSFET may be designed as a so-called junctionless transistor which does not have a pn junction between a source/drain (S/D) and a channel.

In the Ge-channel nMOSFET, S is used as the element segregated in the region between the alloy layer and the channel. Instead of S, a chalcogen element such as Se or Te may be used. In addition, a combination of chalcogen elements (S, Se, Te) may be used as a dopant. The Ge channels may be doped with impurities suitable for the n or p type.

While embodiments have been described, these embodiments have been presented by way of example only, and are not intended to limit the scope of the claims. Indeed, the embodiments described herein may be embodied in a variety of other forms; furthermore, various omissions, substitutions and changes in the form of the embodiments described herein may be made without departing from the spirit. The accompanying claims and their equivalents are intended to cover such forms or modifications as would fall within the scope and spirit.

What is claimed is:

1. A semiconductor device comprising:
    a first complementary semiconductor device provided on a semiconductor substrate, and including a CMOS circuit;
    a metal electrode provided above the first complementary semiconductor device;
    a semiconductor layer provided above the metal electrode, including an nMOS region and a pMOS region separated from each other, and containing Ge;
    a second complementary semiconductor device including an nMOSFET provided on the nMOS region of the semiconductor layer and a pMOSFET provided on the pMOS region of the semiconductor layer;
    a work function control layer provided between the metal electrode and the semiconductor layer including the nMOS region and the pMOS region; and
    an insulating film provided between the semiconductor layer and the work function control layer.

2. The device of claim 1, wherein the metal electrode comprises a first portion below the nMOS region and a second portion below the pMOS region and separated from the first portion.

3. The device of claim 2, further comprising:
    a first signal line connected to the first portion of the metal electrode; and
    a second signal line connected to the second portion of the metal electrode independently.

4. The device of claim 2, further comprising a common signal line connected to the first portion of the metal electrode and the second portion of the metal electrode.

5. The device of claim 1, wherein the work function control layer comprises one of TiN and TaN, and the insulating film comprises a rare-earth oxide.

6. The device of claim 1, wherein the work function control layer comprises one of TiN and TaN, and the insulating film comprises one of a hafnium oxide, an aluminum oxide and a hafnium aluminum oxide.

7. The device of claim 1, wherein the metal electrode is included in an uppermost layer of wiring layers above the first complementary semiconductor device, and the second complementary semiconductor device is electrically connected to the first complementary semiconductor device.

8. The device of claim 1, wherein the metal electrode is included in an intermediate layer of wiring layers above the first complementary semiconductor device, and the second complementary semiconductor device is electrically connected to the first complementary semiconductor device.

9. The device of claim 1, wherein the first complementary semiconductor device is provided on a Si substrate.

* * * * *